United States Patent
Kwean

(10) Patent No.: US 9,373,422 B1
(45) Date of Patent: Jun. 21, 2016

(54) MEMORY DEVICE

(71) Applicant: SK hynix Inc., Gyeonggi-do (KR)

(72) Inventor: Ki-Chang Kwean, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/793,483

(22) Filed: Jul. 7, 2015

(30) Foreign Application Priority Data

Mar. 6, 2015 (KR) ........................ 10-2015-0031658

(51) Int. Cl.
*G11C 7/00* (2006.01)
*G11C 29/00* (2006.01)

(52) U.S. Cl.
CPC ...................... *G11C 29/76* (2013.01)

(58) Field of Classification Search
USPC .................................. 365/222, 210.1, 230.03
See application file for complete search history.

(56) References Cited

U.S. PATENT DOCUMENTS

2012/0106277 A1* 5/2012 Kwean ............ G11C 11/40622
365/194

FOREIGN PATENT DOCUMENTS

KR 1020060066876 6/2006
KR 1020070076045 7/2007

* cited by examiner

*Primary Examiner* — Vu Le
(74) *Attorney, Agent, or Firm* — IP & T Group LLP

(57) ABSTRACT

A memory device including a first cell block including a plurality of word lines and first to $K^{th}$ (K is a natural number) redundancy word lines, a second cell block including a plurality of word lines and $(K+1)^{th}$ to $N^{th}$ (N is a natural number greater than K) redundancy word lines, and a control unit suitable for performing control so that the first to $N^{th}$ redundancy word lines replace the word lines of the first or second cell block, refreshing the word lines of the first and the second cell blocks simultaneously in a first section, and sequentially refreshing the first to $N^{th}$ redundancy word lines in a second section.

19 Claims, 12 Drawing Sheets

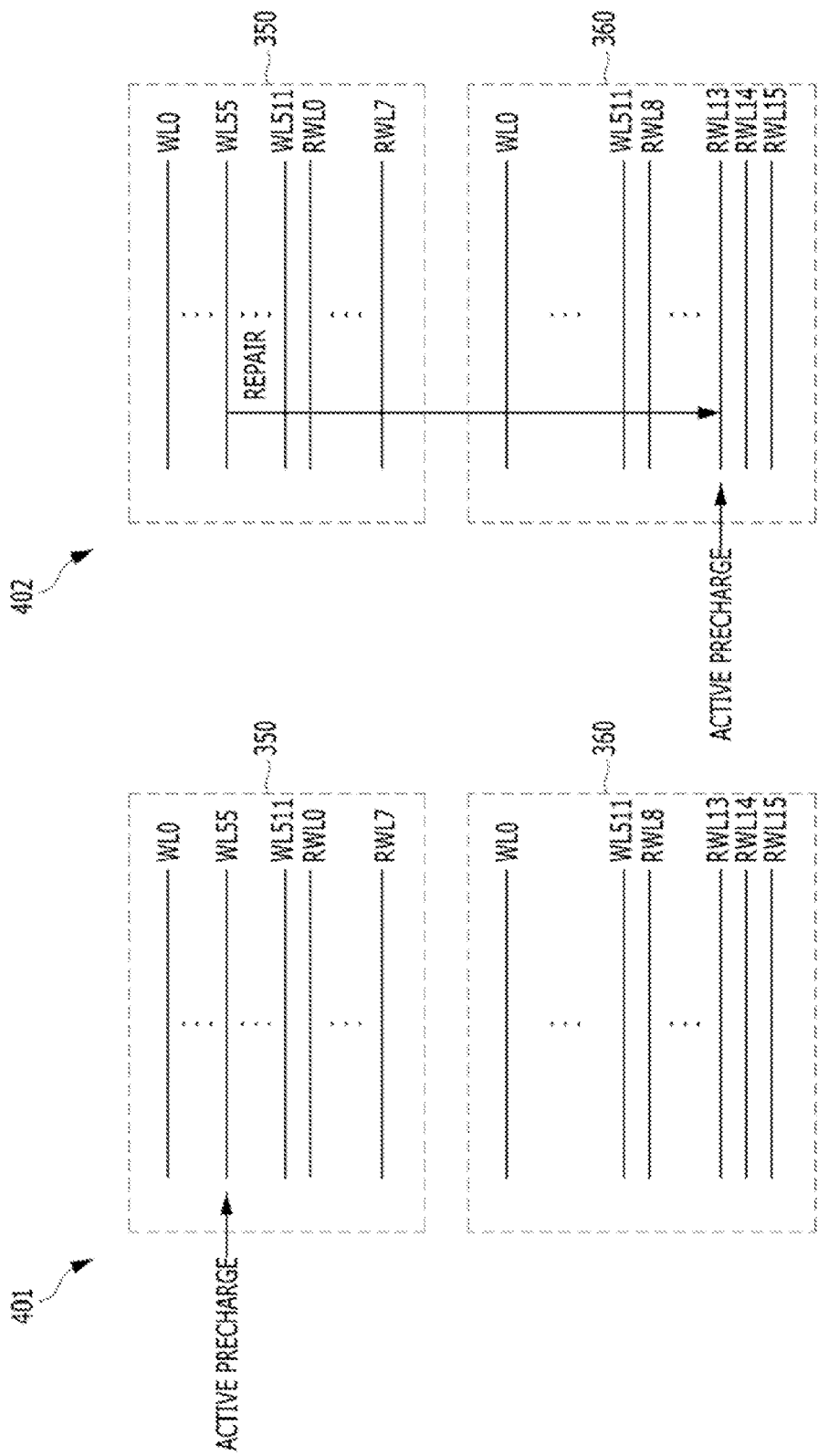

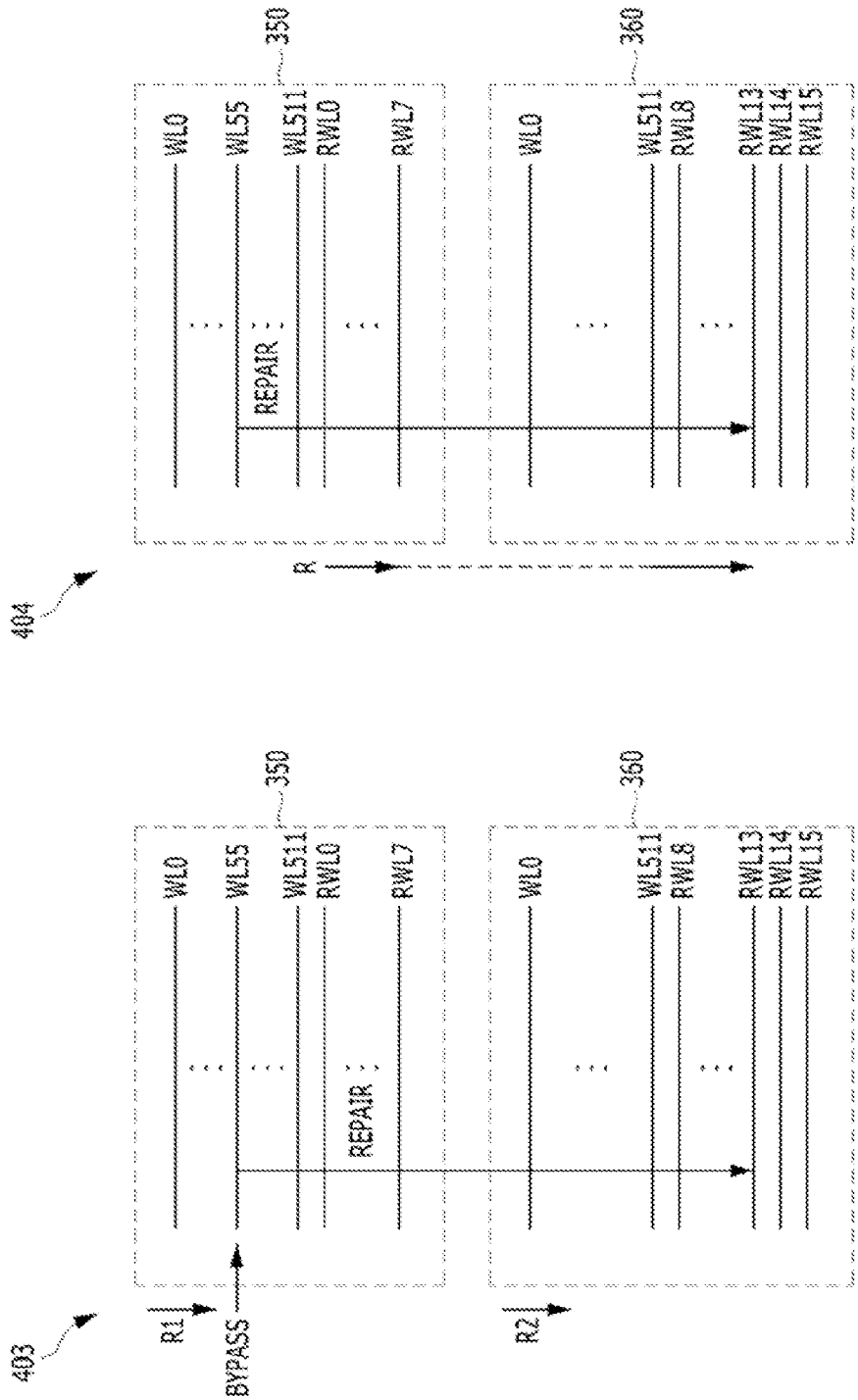

MEMORY DEVICE

CROSS-REFERENCE TO RELATED APPLICATION(S)

The present application claims priority of Korean Patent Application No. 10-2015-0031658, filed on Mar. 6, 2015, which is incorporated herein by reference in its entirety.

BACKGROUND

1. Field

Exemplary embodiments of the present invention relate to a memory device.

2. Description of the Related Art

Memory cells are the most basic unit for storing information and may each store one or more bits of data. Integration of memory devices has increased to the point where tens of millions of memory cells are included in a single memory device. But if even one memory cell has a defect, the memory device may not perform as required. However, discarding such memory devices would hurt product yield.

Several methods are being proposed to handle defective memory cells of memory devices. For example, a memory device may include extra cells (referred to as redundancy cells) in addition to memory cells. The memory device may be repaired using redundancy cells to replace the defective memory cells. This repair operation using redundancy cells is performed on each row/column. That is, the memory and redundancy cells are arranged in rows and columns for each cell block. When a defective memory cell occurs in a cell block, the row/column of memory cells that include the defective memory cell is substituted with a row/column of redundancy cells.

FIG. 1 is a diagram illustrating row repair operations for a memory device.

Referring to FIG. 1, the memory device may include a plurality of cell blocks 110 to 140, each including a plurality of word lines WL0 to WL511 and redundancy word lines RWL0 to RWL7, and address storage units 150 to 180 corresponding to the plurality of cell blocks 110 to 140. The address storage units 150 to 180 may include fuse sets FS0 to FS7 corresponding to the redundancy word lines of the cell blocks 110 to 140.

The address storage units 150 to 180 may store the addresses of the word lines to be replaced with the redundancy word lines in the cell block 110 to 140. For example, if the word line WL0 of the cell block 110 is to be replaced with the redundancy word line RWL0 of the cell block 110, the address of the word line WL0 of the cell block 110 may be stored in the fuse set FS0 of the address storage unit 150. When an active operation is performed, the memory device may activate the redundancy word line RWL0 of the cell block 110 instead of the word line WL0 of the cell block 110 using the address of the word line WL0 of the cell block 110 that has been stored in the fuse set FS0 of the address storage unit 150.

In the memory device of FIG. 1, the redundancy word lines of each cell block may replace only the word lines of the corresponding cell block in which they are included resulting in inefficiencies. For example, when 9 defective word lines are present in the cell block 110, all 9 defective word lines cannot be replaced because 8 redundancy word lines RWL0 to RWL7 are used in the cell block 110. Accordingly, the memory device is treated as defective product even if there are no defective word lines in the remaining cell blocks 120 to 140 and the remaining 24 redundancy word lines of the cell blocks 120 to 140 are not used.

SUMMARY

Various embodiments are directed to a memory device capable of repairing a word line of one cell block using a redundancy word line of another cell block.

Also, various embodiments are directed to a memory device, wherein a word line of one cell block is substituted with a redundancy word line of another cell block by refreshing redundancy word lines only after all the word lines are refreshed and two word lines of each cell block are prevented from being simultaneously activated although the word lines of a plurality of cell blocks are refreshed simultaneously.

In an embodiment, a memory device may including a first cell block including a plurality of word lines and first to $K^{th}$ (K is a natural number) redundancy word lines, a second cell block including a plurality of word lines and $(K+1)^{th}$ to $N^{th}$ (N is a natural number greater than K) redundancy word lines, and a control unit suitable for controlling the first to $N^{th}$ redundancy word lines to replace the word lines of the first or second cell block, refreshing the word lines of the first and the second cell blocks simultaneously in a first section, and sequentially refreshing the first to $N^{th}$ redundancy word lines in a second section.

In an embodiment, a memory device may include a first cell block including a plurality of word lines and first to $K^{th}$ (K is a natural number) redundancy word lines, a second cell block including a plurality of word lines and $(K+1)^{th}$ to $N^{th}$ (N is a natural number greater than K) redundancy word lines, first to $N^{th}$ address storage units corresponding to the first to $N^{th}$ redundancy word lines and suitable for storing addresses of the word lines of the first or second cell block, an address counting unit suitable for storing a counting address by counting when a refresh operation is performed, and a word line control unit suitable for refreshing word lines that belong to the first and the second cell blocks and correspond to the counting address in a first section, and refreshing a redundancy word line that belongs to the first to $N^{th}$ redundancy word lines and corresponds to the counting address in a second section, wherein when the counting address is identical with one or more of the addresses stored in the address storage units in the first section, the word line control unit skips refreshing the word line corresponding to the counting address.

In an embodiment, a memory device may include a plurality of cell blocks including a plurality of word lines, a plurality of redundancy word lines suitable for replacing corresponding word lines of the cell blocks, and a control unit suitable for refreshing the word lines of the cell blocks simultaneously, except for the replaced word lines by the redundancy word lines, in a first section, and sequentially refreshing the redundancy word lines in a second section.

BRIEF DESCRIPTION OF THE DRAWINGS

FIGS. 4A and 4B are diagrams illustrating the operation of the memory device of FIG. 3.

DETAILED DESCRIPTION

Figure 1:
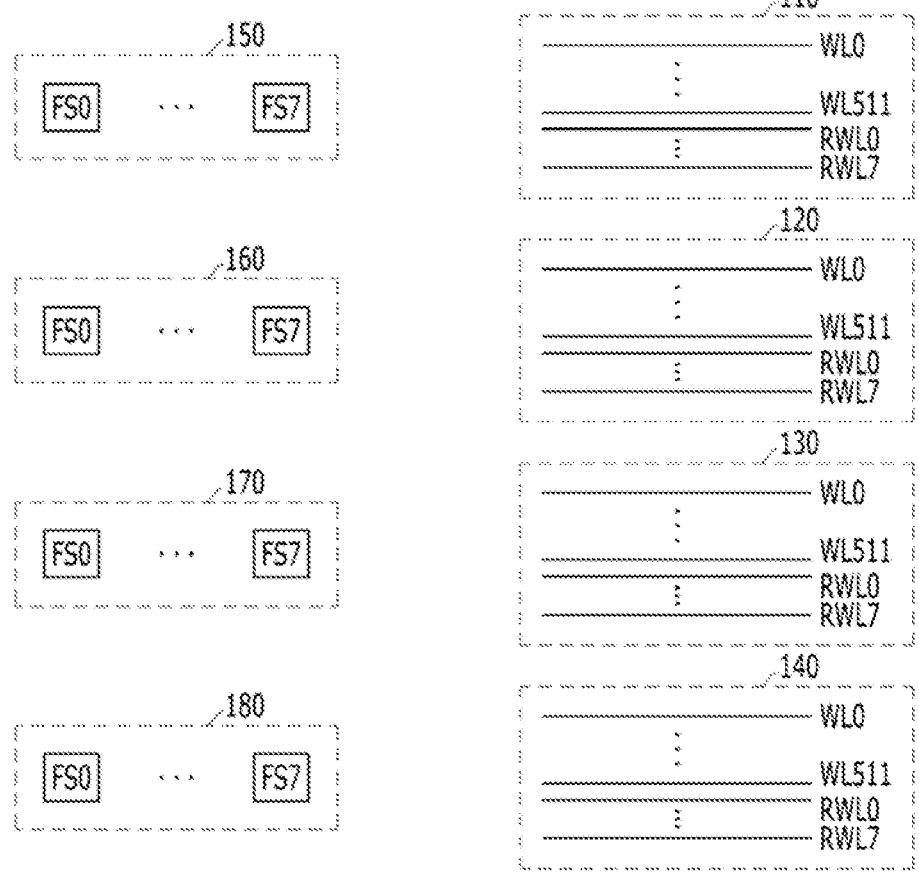
FIG. 1 is a diagram illustrating row repair operations for a memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
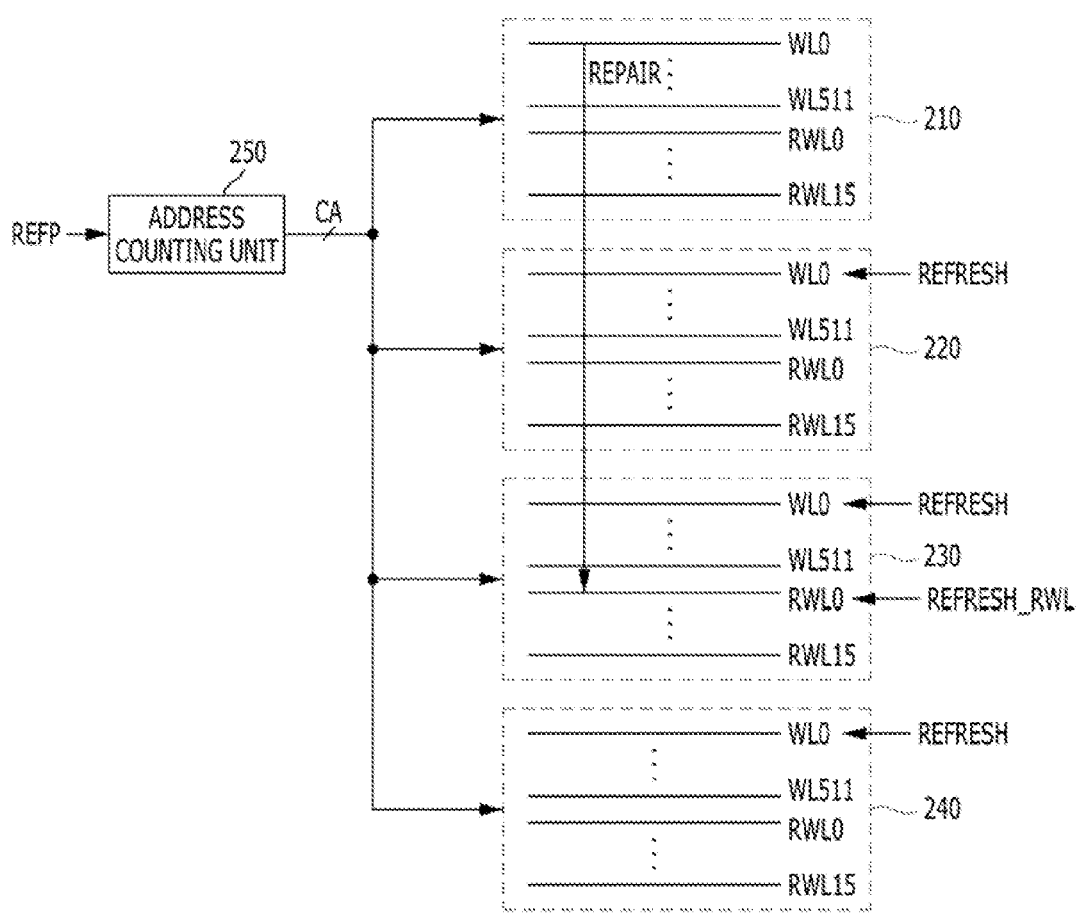
FIG. 2 is a diagram illustrating a refresh operation of a memory device including a plurality of cell blocks.

FIG. 2 is a diagram illustrating a refresh operation of a memory device including a plurality of cell blocks.

Referring to FIG. 2, the memory device may include a plurality of cell blocks 210 to 240 and an address counting unit 250. The plurality of cell blocks 210 to 240 may include word lines WL0 to WL511 and redundancy word lines RWL0 to RWL15. In the memory device of FIG. 2, the redundancy word lines RWL0 to RWL15 included in each of the cell blocks 210 to 240 may also repair word lines included in another cell block.

When performing a refresh operation, the memory device of FIG. 2 may refresh the plurality of cell blocks 210 to 240 simultaneously. More specifically, whenever a refresh pulse REFP is activated, the memory device may refresh the word lines of the respective cell blocks 210 to 240. The memory device may select word lines to be refreshed in the respective cell blocks 210 to 240 using a counting address CA generated by the address counting unit 250. Whenever the refresh pulse REFP is applied, the address counting unit 250 may change the value of the counting address CA.

When performing a refresh operation, the memory device of FIG. 2 may sequentially select the word line WL0 to the word line WL511 of each of the cell blocks 210 to 240 using the counting address CA. If a selected word line has been replaced by a redundancy word line, the memory device may refresh the redundancy word line instead of the selected word line.

In this example, the word line WL0 of the cell block 210 has been replaced by the redundancy word line RWL0 of the cell block 230. When the refresh pulse REFP is activated, the word lines of the respective cell blocks 210 to 240 corresponding to the counting address CA are refreshed. For example, if the counting address CA corresponds to the word line WL0, the word lines WL0 of the respective cell blocks 220 to 240 are refreshed (REFRESH). Since the word line WL0 of the cell block 210 has been replaced by the redundancy word line RWL0 of the cell block 230, the redundancy word line RWL0 of the cell block 230 is refreshed (REFRESH_RWL) instead of the word line WL0 of the cell block 210. When the two word lines WL0 and RWL0 of a single cell block 230 are simultaneously refreshed, the data of memory cells connected to the refreshed word lines collide.

Accordingly, in order to repair a word line of one cell block using a redundancy word line of another cell block, such a data collision is to be prevented when a refresh operation is performed.

In the examples of FIGS. 3 to 6, a memory device includes two cell blocks and each of the cell blocks includes 512 word lines and 8 redundancy word lines. The number of cell blocks included in a memory device and the number of word lines and redundancy word lines included in each cell block may be changed depending on the circuit design of the memory device.

Figure 3:
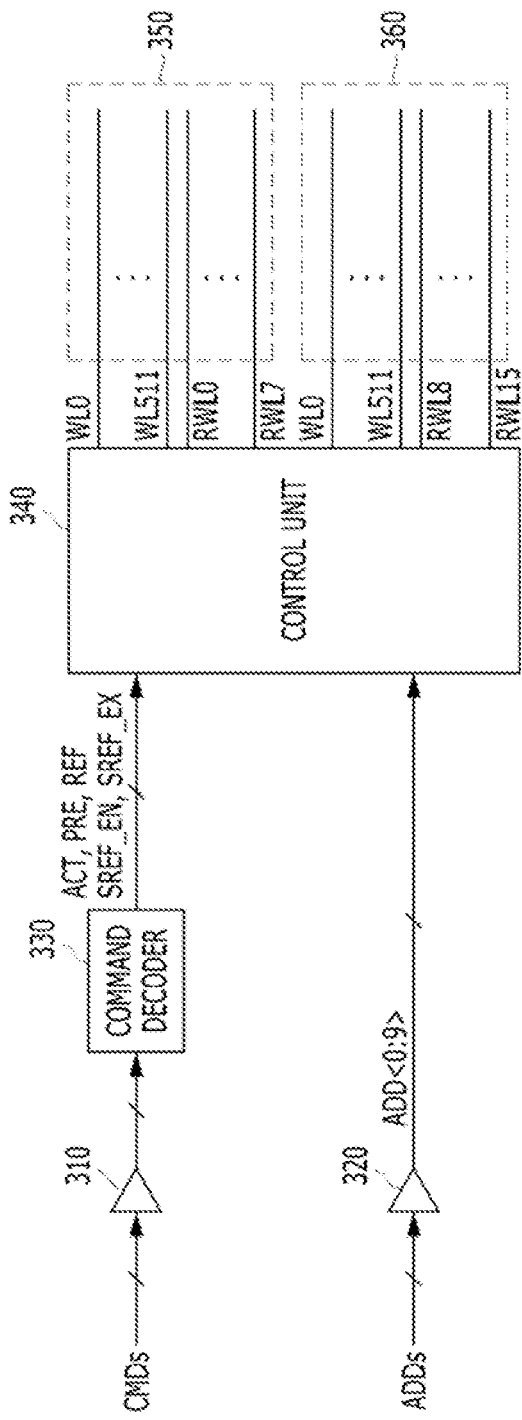
FIG. 3 is a configuration diagram illustrating a memory device in accordance with an embodiment of the present invention.

FIG. 3 is a configuration diagram illustrating a memory device in accordance with an embodiment of the present invention.

Referring to FIG. 3, the memory device may include a command input unit 310, an address input unit 320, a command decoder 330, a control unit 340, a first cell block 350, and a second cell block 360.

The command input unit 310 may receive commands CMDs from a memory controller, and the address input unit 320 may receive addresses ADDs from the memory controller. Each of the commands CMDs and the addresses ADDs may include signals of multiple bits.

The command decoder 330 may generate an active command ACT, a precharge command PRE, a refresh command REF, a self-refresh start command SREF_EN, and a self-refresh end command SREF_EX by decoding the commands CMDs received from the command input unit 310. The command decoder 330 may activate which of the active command ACT, the precharge command PRE, the refresh command REF, the self-refresh start command SREF_EN, and the self-refresh end command SREF_EX corresponds to a combination of the received commands CMDs.

The first cell block 350 may include a plurality of word lines WL0 to WL511 and first to eighth redundancy word lines RWL0 to RWL7. The second cell block 360 may include a plurality of word lines WL0 to WL511 and ninth to sixteenth redundancy word lines RWL0 to RWL15. Each of the word lines WL0 to WL511 and RWL0 to RWL15 may be connected to memory cells MC.

The control unit 340 may control the word lines WL0 to WL511 of the cell blocks 350 and 360 in response to the commands ACT, PRE, REF, SREF_EN, and SREF_EX. The control unit 340 may activate a selected word line in response to an input address ADD<0:9> when the active command ACT is activated and precharge the activated word line when the precharge command PRE is activated. When the refresh command REF is activated, the control unit 340 may refresh a word line (i.e., activate the word line for a specific time).

Furthermore, the control unit 340 may periodically refresh a word line during a section from a point of time at which the self-refresh start command SREF_EN is activated to a point of time at which the self-refresh end command SREF_EX is activated.

When the active command ACT is activated, the control unit 340 may activate a word line corresponding to the input address ADD<0:9>. Each of the input addresses ADD<0:9> may include a block address ADD<9> for selecting one of the first and the second cell blocks 350 and 360 and a row address ADD<0:8> for selecting one of the word lines WL0 to WL511 of the selected cell block. When the word line corresponding to the input address ADD<0:9> has been replaced by a redundancy word line, the control unit 340 may activate the redundancy word line.

In a first section, the control unit 340 may refresh the first and the second cell blocks 350 and 360 simultaneously and sequentially refresh the plurality of word lines WL0 to WL511 of the first and the second cell blocks 350 and 360. The first section may be a section in which the word lines WL0 to WL511 are refreshed.

In the first section, the control unit 340 may bypass the refresh of a selected word line that has been substituted with a redundancy word line. That is, the control unit 340 skips a refresh operation on the selected word line and the substituted redundancy word line.

In a second section, the control unit 340 may sequentially refresh the first to sixteenth redundancy word lines RWL0 to RWL15. The redundancy word lines RWL0 to RWL15 of the second section may be refreshed. The first section and the second section may be alternately repeated. For example, when all the word lines WL0 to WL511 of the first and the second cell blocks 350 and 360 are sequentially refreshed in the first section, the memory device may terminate the first section and enter the second section. When all the redundancy word lines RWL0 to RWL15 are sequentially refreshed in the second section, the first section may start again. In the second section, the control unit 340 bypasses the refresh of a redundancy word line that has failed among the first to sixteenth redundancy word lines RWL0 to RWL15.

FIGS. 4A and 4B are diagrams illustrating the operation of the memory device of FIG. 3. FIG. 4A is a diagram illustrating the active operation of the memory device, and FIG. 4B is a diagram illustrating the refresh operation of the memory device. Referring to FIGS. 4A and 4B, the first and the second cell blocks 350 and 360 and the word lines WL0 to WL511 and the redundancy word lines RWL0 to RWL15 are illustrated.

A left-sided diagram 401 of FIG. 4A illustrates a word line (e.g., the word line 55 of the first cell block 350) corresponding to the input address ADD<0:9> in the memory device that has not been repaired. A right-sided diagram 402 of FIG. 4A illustrates that a word line (e.g., the word line 55 of the first cell block 350) corresponding to the input address ADD<0:9> in the memory device has been repaired (e.g., the word line 55 of the first cell block 350 has been replaced by the redundancy word line RWL13).

Referring to the diagram 401, when the active command ACT is applied and the word line 55 of the first cell block 350 is selected by the address ADD<0:9>, the word line 55 of the first cell block 350 is activated. Thereafter, when the precharge command PRE is activated, the word line 55 of the first cell block 350 is precharged.

Referring to the diagram 402, when the active command ACT is applied and the word line 55 of the first cell block 350 is selected by the address ADD<0:9>, the redundancy word line RWL13 is activated instead of the word line 55 of the first cell block 350. When the precharge command PRE is activated, the redundancy word line RWL13 is precharged.

A left-sided diagram 403 of FIG. 4B illustrates a refresh operation in the first section, and a right-sided diagram 404 of FIG. 4B illustrates a refresh operation in the second section. Likewise, as shown in the diagram 402 of FIG. 4A, the word line 55 of the first cell block 350 in the memory device has been replaced by the redundancy word line RWL13.

Referring to the diagram 403, in the first section, the first and the second cell blocks 350 and 360 are refreshed simultaneously, and the word lines WL0 to WL511 of the first and the second cell blocks 350 and 360 are refreshed one at a time. In the diagram 403, arrows R1 and R2 denote refresh directions.

When the word lines WL0 to WL54 have been sequentially refreshed and the word line WL55 is to be refreshed in the first and second cell blocks 350 and 360, the word line WL55 of the second cell block 360 is properly refreshed. In contrast, the word line WL55 and the redundancy word line RWL13 of the first cell block 350 are bypassed. There is no influence on the operation of the memory device although the word line WL55 of the first cell block 350 is not refreshed because it is not used as a defective word line. Since the redundancy word line RWL13 is not refreshed, the second cell block 360 is prevented from simultaneously refreshing two word lines (i.e., the word line WL55 and the redundancy word line RWL13). Thereafter, when the word lines WL511 of the first and the second cell blocks 350 and 360 are refreshed, the first section terminates, and the second section starts.

Referring to the diagram 404, in the second section, the redundancy word lines RWL0 to RWL15 are sequentially refreshed. In the diagram 404, an arrow R denotes a refresh direction. In the second section, there is no concern that two word lines may be simultaneously refreshed in a single cell block because only the redundancy word lines are refreshed. In the second section, however, the refresh of a defective redundancy word line of the redundancy word lines RWL0 to RWL15 is bypassed. Thereafter, when the redundancy word line RWL15 is refreshed, the second section terminates, and the first section starts.

In the memory device of FIG. 3, a refresh section is divided into two sections, and word lines and redundancy word lines are refreshed in different sections. A repaired word line is skipped without being refreshed in a section for refreshing word lines. Instead, a redundancy word line replacing the repaired word line is refreshed in a section for refreshing redundancy word lines. Accordingly, two word lines being refreshed in a single cell block at the same time is prevented. A word line of one cell block may be repaired using a redundancy word line of any other cell block, thereby increasing utilization efficiency of redundancy word lines. Refresh operations may be quickly completed because all the cell blocks are refreshed simultaneously.

Figure 5:
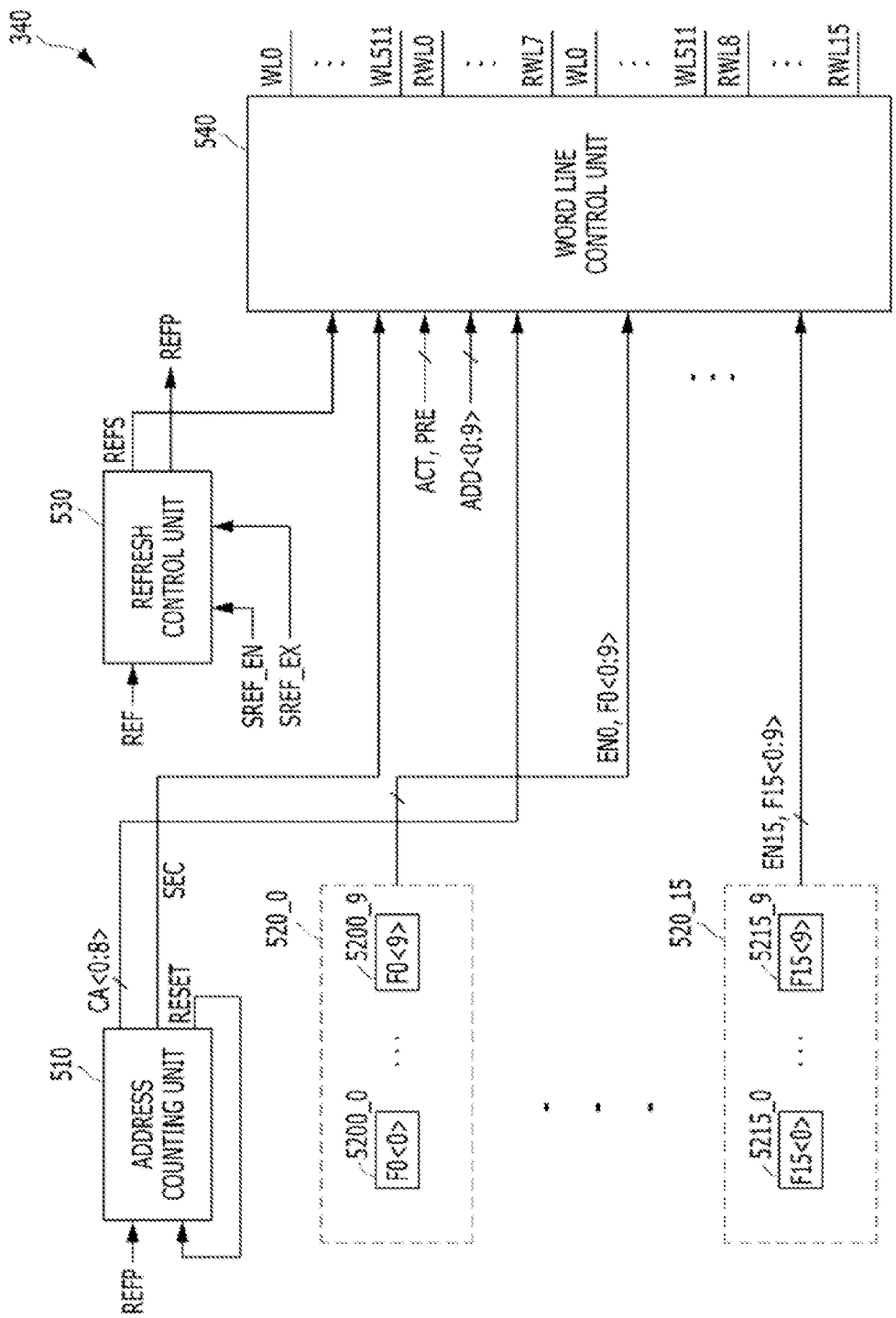
FIG. 5 is a configuration diagram illustrating a control unit 340 of FIG. 3.

FIG. 5 is a configuration diagram illustrating the control unit 340 of FIG. 3.

Referring to FIG. 5, the control unit 340 may include an address counting unit 510, first to sixteenth address storage units 520_0 to 520_15, a refresh control unit 530, and a word line control unit 540.

When a refresh operation is performed, the address counting unit 510 may generate a counting address CA<0:9> by counting. The address counting unit 510 may increase the value of the counting address CA<0:9> by 1 by counting whenever the refresh pulse REFP is activated. That is, when a $K^{th}$ word line has been selected, the counting address CA<0:9> is changed so that a $(K+1)^{th}$ word line is selected next.

The address counting unit 510 may deactivate a section signal SEC while counting the values of the counting addresses CA<0:9> as values (e.g., 0 to 511) corresponding to the word lines WL0 to WL511 of the first and the second cell blocks 350 and 360 and may activate the section signal SEC while counting the values of the counting addresses CA<0:9> as values (e.g., 512 to 527) corresponding to the redundancy word lines RWL0 to RWL15 of the first and the second cell blocks 350 and 360. The section signal SEC indicates any one of the first and the second sections, and it may be deactivated in the first section and activated in the second section.

When the value of the counting address CA<0:9> reaches 527, the address counting unit 510 may activate a reset signal RESET and count the counting address CA<0:9> from 0 again. The address counting unit 510 may output only the counting addresses CA<0:8>.

The address storage units 520_0 to 520_15 may correspond to the respective redundancy word lines RWL0 to RWL15. The address storage units 520_0 to 520_15 may store the addresses of word lines to be repaired (hereinafter referred to as repair addresses). The address storage units 520_0 to 520_15 may include a plurality of fuses 5200 to 5215 for storing the bits of multi-bit information. The address storage units 520_0 to 520_15 may output repair addresses F0<0:9> to F15<0:9> stored in the plurality of fuses 5200 to 5215 and enable signals EN0 to EN15.

The fuses 5200_9 to 5215_9 may store block addresses F0<9> to F15<9> to select a cell block. The fuses 5200_0~5200_8 to 5215_0~5215_8 may store addresses F0<0:8> to F15<0:8> to designate a word line in a selected cell block. The enable signals EN0 to EN15 are deactivated in the initial state. When a memory device is fabricated, the enable signal of an address storage unit in which a repair address is stored is activated. In contrast, although the repair address is stored, the enable signal of a word line storage unit corresponding to a defective redundancy word line is deactivated.

For example, in the initial state, the enable signal EN0 has been deactivated to "0." If a repair address is stored in the address storage unit 520_0 in the process of fabricating a memory device, the enable signal EN0 is activated to "1." If a defect has occurred in the redundancy word line RWL0, the enable signal EN0 is deactivated to "0." If the address of the word line WL0 of the second cell block 360 is to be stored in the address storage unit 520_0, a block address (e.g., "1") to designate the second cell block 360 may be stored in the fuse 5200_9, and addresses (e.g., "000000000") corresponding to the location of the word line WL0 may be stored in the fuses 5200_0 to 5200_8.

The refresh control unit 530 may control the refresh operation of the memory device. The refresh operation is divided into an auto-refresh operation and a self-refresh operation. The auto-refresh operation is performed by a command applied to a system including a memory device. The self-refresh operation is autonomously performed by a memory device when a system including the memory device does not operate for a specific time. The refresh command REF is a command that controls the auto-refresh operation, and the self-refresh start command SREF_EN and the self-refresh end command SREF_EX are commands that control the self-refresh operation.

The refresh control unit 530 may activate the refresh pulse REFP and a refresh signal REFS in response to the refresh command REF or periodically activate the refresh pulse REFP and the refresh signal REFS in a section defined by the self-refresh start and end commands SREF_EN and SREF_EX. The refresh pulse REFP and the refresh signal REFS are periodically activated from the time when the self-refresh start command SREF_EN is applied to the time when the self-refresh end command SREF_EX is applied. The refresh signal REFS may be activated in the section in which a refresh operation is performed.

The word line control unit 540 may activate a word line corresponding to the address ADD<0:9> when the active command ACT is activated. If the address ADD<0:9> is identical with one of the repair addresses F0<0:9> to F15<0:9>, the word line control unit 540 may activate a redundancy word line corresponding to the one of repair addresses F0<0:9> to F15<0:9> instead of the word line corresponding to the address ADD<0:9>. The word line control unit 540 may precharge an activated word line when the precharge command PRE is activated.

When the refresh signal REFS is activated in the first section (i.e., the section in which the section signal SEC is deactivated), the word line control unit 540 may refresh word lines corresponding to the counting address CA<0:8> in the first and the second cell blocks 350 and 360 simultaneously. If the counting address CA<0:8> is identical with one or more of the repair addresses F0<0:8> to F15<0:8>, the refreshes of word lines and redundancy word lines corresponding to the one or more of repair addresses F0<0:9> to F15<0:9> may be bypassed.

For reference, only counting addresses CA<0:8> of the counting addresses CA<0:9> are required to select word lines in the first section. The reason for this is that the number of word lines of the cell block is 512. Furthermore, only counting addresses CA<0:3> of the counting addresses CA<0:9> are required to select redundancy word lines in the second section. The reason for this is that the number of redundancy word lines is 16. If a counting address is identical with a repair address in the first section, it means that the counting address CA<0:8> is identical with one of the repair addresses F0<0:8> to F15<0:8>.

It is assumed that the value of the repair address F0<0:9> corresponds to the word line WL511 of the second cell block 360 (e.g., F0<9>="1", and F0<0:8>="111111111"). If the counting address CA<0:8> is "11111111", the word lines WL511 need to be refreshed in the first and the second cell blocks 350 and 360. However, since the counting address CA<0:8> is identical with the repair address F0<0:8>, the refresh of the word line WL511 of the second cell block 360 corresponding to the repair address F0<0:9> is bypassed, and only the word line WL511 of the first cell block 350 is refreshed. Furthermore, the refresh of the redundancy word line RWL0 corresponding to the repair address F0<0:9> is also bypassed.

When the refresh signal REFS is activated in the second section (i.e., the section in which the section signal SEC has been activated), the word line control unit 540 may refresh a redundancy word line corresponding to the counting address CA<0:3>. That is, the word line control unit 540 may sequentially refresh the redundancy word lines RWL0 to RWL15. The word line control unit 540 may not simultaneously refresh the first and the second cell blocks 350 and 360 in the second section. In this case, the refresh of a redundancy word line corresponding to a deactivated enable signal among the redundancy word lines RWL0 to RWL15 may be bypassed.

Figure 6:
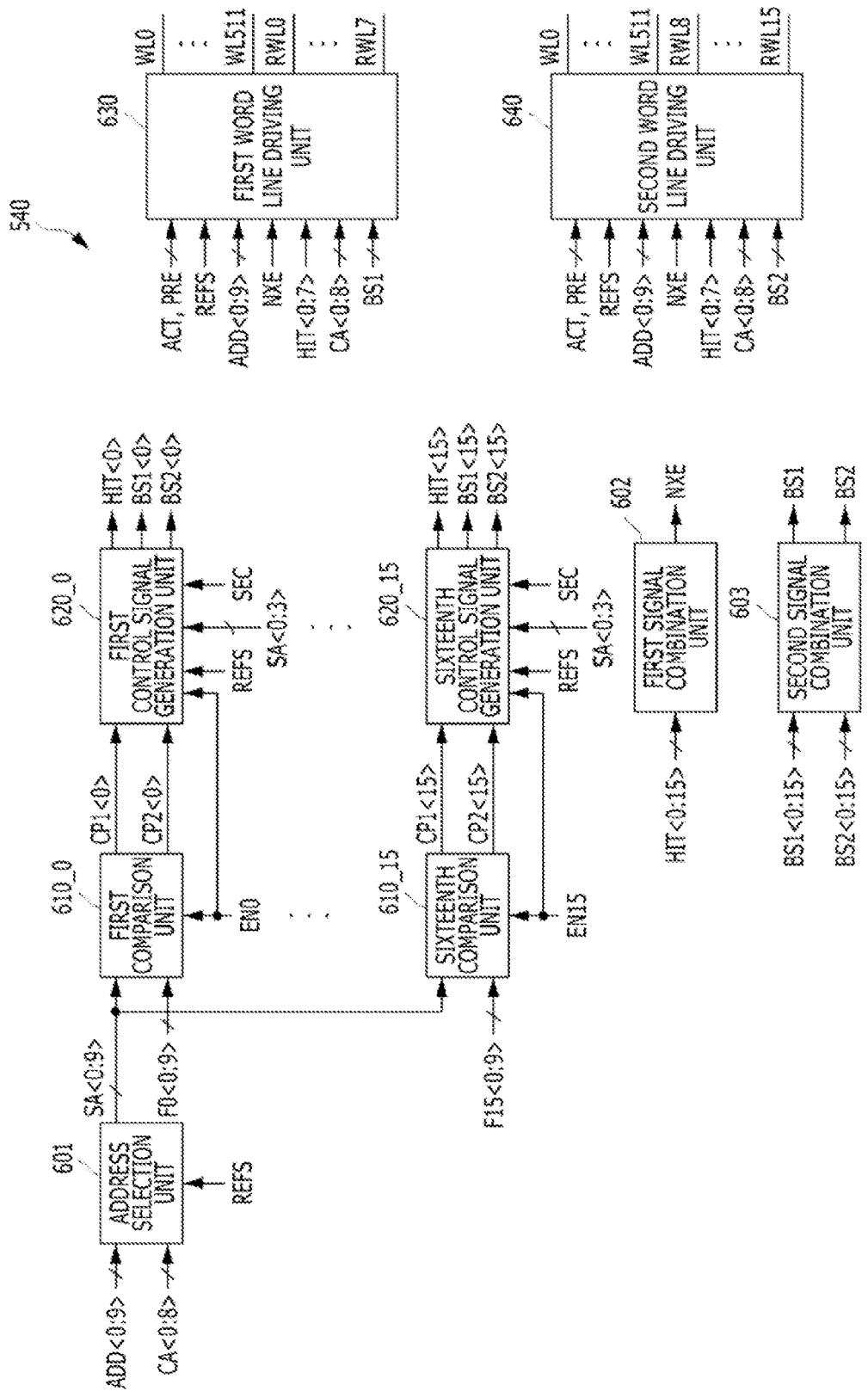
FIG. 6 is a configuration diagram illustrating a word line control unit 540 of FIG. 5.

FIG. 6 is a configuration diagram illustrating the word line control unit 540 of FIG. 5.

Referring to FIG. 6, the word line control unit 540 may include first to sixteenth comparison units 610_0 to 610_15, first to sixteenth control signal generation units 620_0 to 620_15, a first word line driving unit 630, a second word line driving unit 640, an address selection unit 601, and first and second signal combination units 602 and 603.

The address selection unit 601 may receive the address ADD<0:9> and the counting address CA<0:8>, may select one address, and may output the selected address (i.e., the input address SA<0:9> of the comparison units 610_1 to 610_15). When the refresh signal REFS is deactivated, the address selection unit 601 may transfer the addresses ADD<0> to ADD<9> as the respective input addresses SA<0> to SA<9>. When the refresh signal REFS is activated, the address selection unit 601 may transfer the counting addresses CA<0> to CA<8> as the respective input addresses SA<0> to SA<8>.

The comparison units 610_0 to 610_15 correspond to the respective address storage units 520_0 to 520_15. When the enable signals EN0 to EN15 is activated, the comparison units 610_0 to 610_15 may compare the input address SA<0:9> with the repair addresses F0<0:9> to F15<0:9> of the address storage units 520_0 to 520_15. The comparison units 610_0 to 610_15 may generate first comparison signals CP1<0:15> and second comparison signals CP2<0:15>, respectively. The first comparison signals CP1<0> to CP1<15> may indicate the results of comparisons between the input address SA<0: 8> and the repair addresses F0<0:8> to F15<0:8>. The second comparison signals CP2<0> to CP2<15> may indicate the results of comparisons between the input address SA<9> and the respective repair addresses F0<9> to F15<9>. The first comparison signal CP1<X> (X is an integer of 0<X515) may be activated if the input address SA<0:8> is identical with the repair address FX<0:8>. The second comparison CP2<X> may be activated if the input address SA<9> is identical with the repair address FX<9>.

The control signal generation units 620_0 to 620_15 may generate respective control signals HIT<0:15> and respective bypass signals BS1<0:15> and BS2<0:15> for controlling a corresponding redundancy word line based on the comparison results CP1<0:15> and CP2<0:15> of the respective comparison units 610_0 to 610_15. The first bypass signals BS1<0> to BS1<15> may correspond to the first cell block 350, and the second bypass signals BS2<0> to BS2<15> may correspond to the second cell block 360.

When the refresh signal REFS is deactivated (i.e., the active precharge operation of a common word line), the control signal generation units 620_0 to 620_15 may activate the respective control signals HIT<0:15> when all of the respective comparison signals CP1<0:15> and CP2<0:15> are activated and may deactivate the control signals HIT<0:15> if not.

For example, when the refresh signal REFS is deactivated, the control signal generation unit 620_0 may activate the control signal HIT<0> if both the comparison signals CP1<0> and CP2<0> are activated and may deactivate the control signal HIT<0> if not.

When the refresh signal REFS are activated and the section signal SEC is deactivated (I.e., a refresh operation in the first section), the control signal generation units 620_0 to 620_15 may deactivate the respective control signals HIT<0:15>. Furthermore, the control signal generation units 620_0 to 620_15 may deactivate the respective bypass signals BS1<0: 15> and BS2<0:15> when the respective comparison signals CP1<0:15> are deactivated and may activate a bypass signal corresponding to a cell block designated by the values of the repair addresses F0<9> to F15<9> when the respective comparison signals CP1<0:15> are activated.

For example, it is assumed that the repair address F0<0:9> has a value corresponding to the word line WL0 of the first cell block 350 (e.g., F0<9>="0", and F0<0: 8>="000000000"). If the counting address CA<0:8> is "000000000", the comparison signal CP1<0> is activated, and the control signal generation unit 620_0 may activate the bypass signal BS1<0> corresponding to the value of the repair address F0<9> so that the refresh of the first cell block 350 is bypassed.

When both the refresh signal REFS and the section signal SEC are activated (i.e., a refresh operation in the second section), the control signal generation units 620_0 to 620_15 may decode the counting address CA<0:3> and activate the control signal HIT<0:15> corresponding to the value of the counting address CA<0:3>. For example, in the second section, if the value of the counting address CA<0:3> is "0000", the control signal generation unit 620_0 activates the control signal HIT<0>. In this case, if the enable signal EN0 has been deactivated, the control signal generation unit 620_0 does not activate the control signal HIT<0> although the value of the counting address CA<0:3> is "0000."

The first signal combination unit 602 may deactivate a signal NXE when one or more of the control signals HIT<0: 15> are enabled and may activate the signal NXE when all of the control signals HIT<0:15> are deactivated.

The second signal combination unit 603 may activate a first bypass combination signal BS1 when one or more of the bypass signals BS1<0> to BS1<15> are activated and may deactivate the first bypass combination signal BS1 when all of the bypass signals BS1<0> to BS1<15> are deactivated. Furthermore, the second signal combination unit 603 may activate a second bypass combination signal BS2 when one or more of the bypass signals BS2<0> to BS2<15> are activated and may deactivate the second bypass combination signal BS2 when all of the bypass signals BS2<0> to BS2<15> are deactivated.

The first word line driving unit 630 may correspond to the first cell block 350 and control the word lines WL0 to WL511 and the redundancy word lines RWL0 to RWL7 of the first cell block 350. If the active command ACT has been activated, the first word line driving unit 630 may activate a word line corresponding to the address ADD<0:9> when the signal NXE is activated and may activate a redundancy word line corresponding to a control signal that has been activated among the control signals HIT<0> to HTT<7> when the signal NXE is deactivated. When the precharge command PRE is activated, the first word line driving unit 630 may precharge an activated word line. If the refresh signal REFS has been activated, the first word line driving unit 630 may refresh a word line corresponding to the counting address CA<0:8> when the signal NXE is activated and may refresh a redundancy word line corresponding to a control signal that has been activated among the control signals HIT<0> to HTT<7> when the signal NXE is deactivated. In this case, although the signal NXE has been activated, the first word line driving unit 630 may not perform a refresh operation when the first bypass combination signal BS1 is activated.

The second word line driving unit 640 may correspond to the second cell block 360 and control the word lines WL0 to WL511 and the redundancy word lines RWL8 to RWL15 of the second cell block 360. If the active command ACT has been activated, the second word line driving unit 640 may activate a word line corresponding to the address ADD<0:9> when the signal NXE is activated and may activate a redundancy word line corresponding to a control signal that has been activated among the control signals HIT<8> to HTT<15> when the signal NXE is deactivated. When the precharge command PRE is activated, the second word line driving unit 640 may precharge an activated word line. If the refresh signal REFS has been activated, the second word line driving unit 640 may refresh a word line corresponding to the counting address CA<0:8> when the signal NXE is activated and may refresh a redundancy word line corresponding to a control signal that has been activated among the control signals HIT<8> to HTT<15> when the signal NXE is deactivated. In this case, although the signal NXE has been activated, the second word line driving unit 640 may not perform a refresh operation when the second bypass combination signal BS2 is activated.

In the following descriptions of FIGS. 7 to 10, it is described as an example that a memory device includes four cell blocks and each of the cell blocks includes 256 word lines and 4 redundancy word lines.

The number of cell blocks included in a memory device and the number of word lines and redundancy word lines included in each cell block may be changed depending on the circuit design of the memory device.

Figure 7:
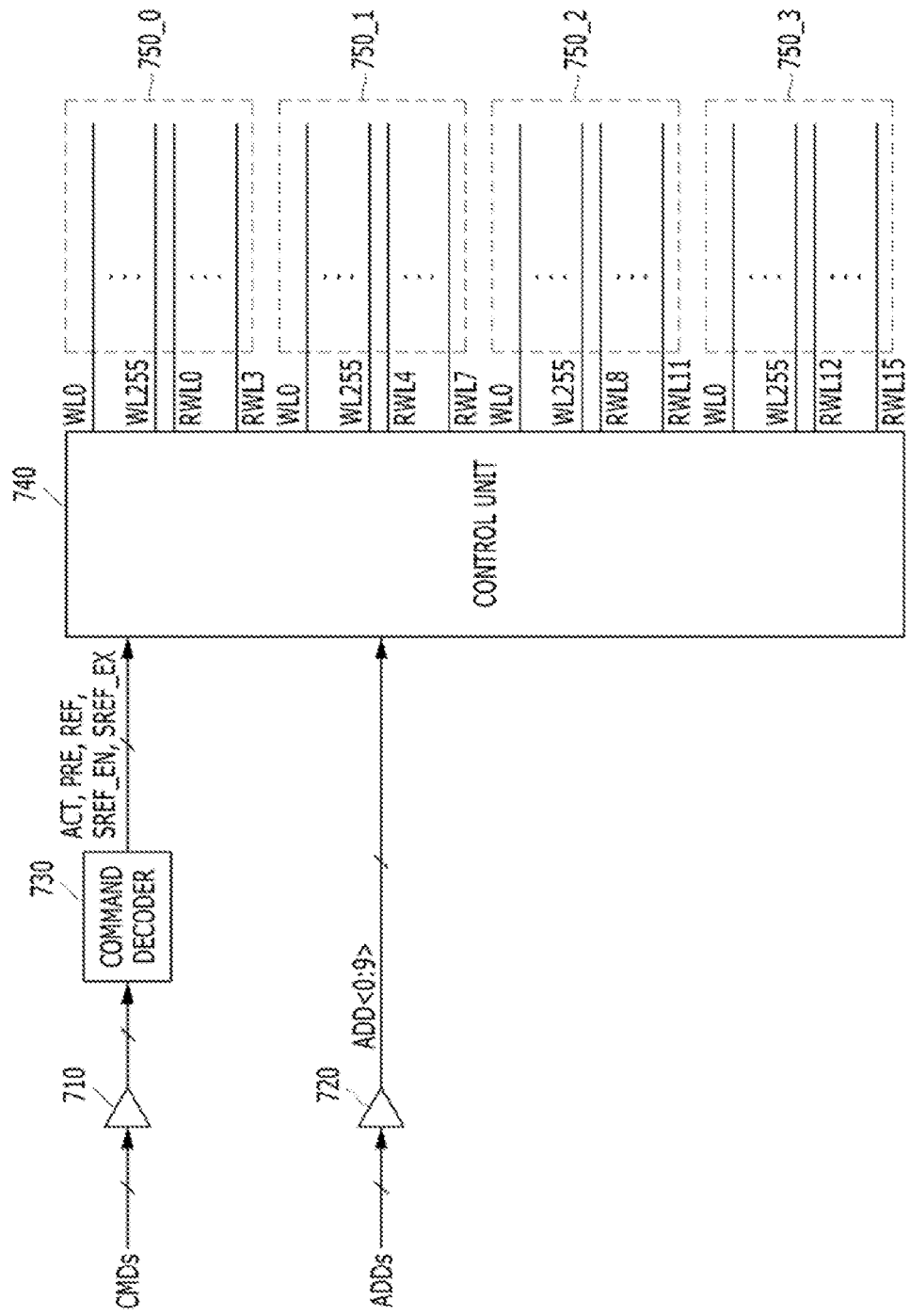
FIG. 7 is a configuration diagram illustrating a memory device in accordance with an embodiment of the present invention.

FIG. 7 is a configuration diagram illustrating a memory device in accordance with an embodiment of the present invention.

Referring to FIG. 7, the memory device may include a command input unit 710, an address input unit 720, a command decoder 730, a control unit 740, and first to fourth cell blocks 750_0 to 750_3.

Each of the first to fourth cell blocks 750_0 to 750_3 may include a plurality of word lines WL0 to WL255. The first cell block 750_0 may include redundancy word lines RWL0 to RWL3, and the second cell block 750_1 may include redundancy word lines RWL4 to RWL7, and the third cell block 750_2 may include redundancy word lines RWL8 to RWL11, and the fourth cell block 750_3 may include redundancy word lines RWL12 to RWL15. The word lines WL0 to WL255 and the redundancy word lines RWL0 to RWL15 may be connected to memory cells MC.

The control unit 740 may control the word lines WL0 to WL255 of the cell blocks 750_0 to 750_3 in response to commands ACT, PRE, REF, SREF_EN, and SREF_EX. The control unit 740 may activate a selected word line in response to an input address ADD<0:9> when the active command ACT is activated and precharge the activated word line when the precharge command PRE is activated. When the refresh command REF is activated, the control unit 740 may refresh a selected word line (i.e., activate the selected word line for a specific time). Furthermore, the control unit 740 may periodically refresh a selected word line in the section from when the self-refresh start command SREF_EN is activated to when the self-refresh end command SREF_EX is activated.

The control unit 740 may activate a word line corresponding to the input address ADD<0:9> when the active command ACT is activated. The input address ADD<0:9> may include a block address ADD<8:9> for selecting one of the first to fourth cell blocks 750_0 and 750_3 and a row address ADD<0:7> for selecting one of the word lines WL0 to WL255 of the selected cell block. When the word line corresponding to the input address ADD<0:9> has been replaced by a redundancy word line, the control unit 740 may activate the redundancy word line.

The control unit 740 may refresh the first to fourth cell blocks 750_0 to 750_3 simultaneously in a first section. The control unit 740 may sequentially refresh the plurality of word lines WL0 to WL255 of the first to fourth cell blocks 750_0 to 750_3. In the first section, the control unit 740 may bypass the refresh of a selected word line that has been substituted with a redundancy word line. That is, the control unit 740 skips a refresh operation on the selected word line and the substituted redundancy word line.

The control unit 740 may sequentially refresh the redundancy word lines RWL0 to RWL15 in a second section. The refresh of a defective redundancy word line of the redundancy word lines RWL0 to RWL15 may be bypassed. The second section may be a section in which a redundancy word line is refreshed. The first section and the second section may be alternately repeated.

Figure 8A:
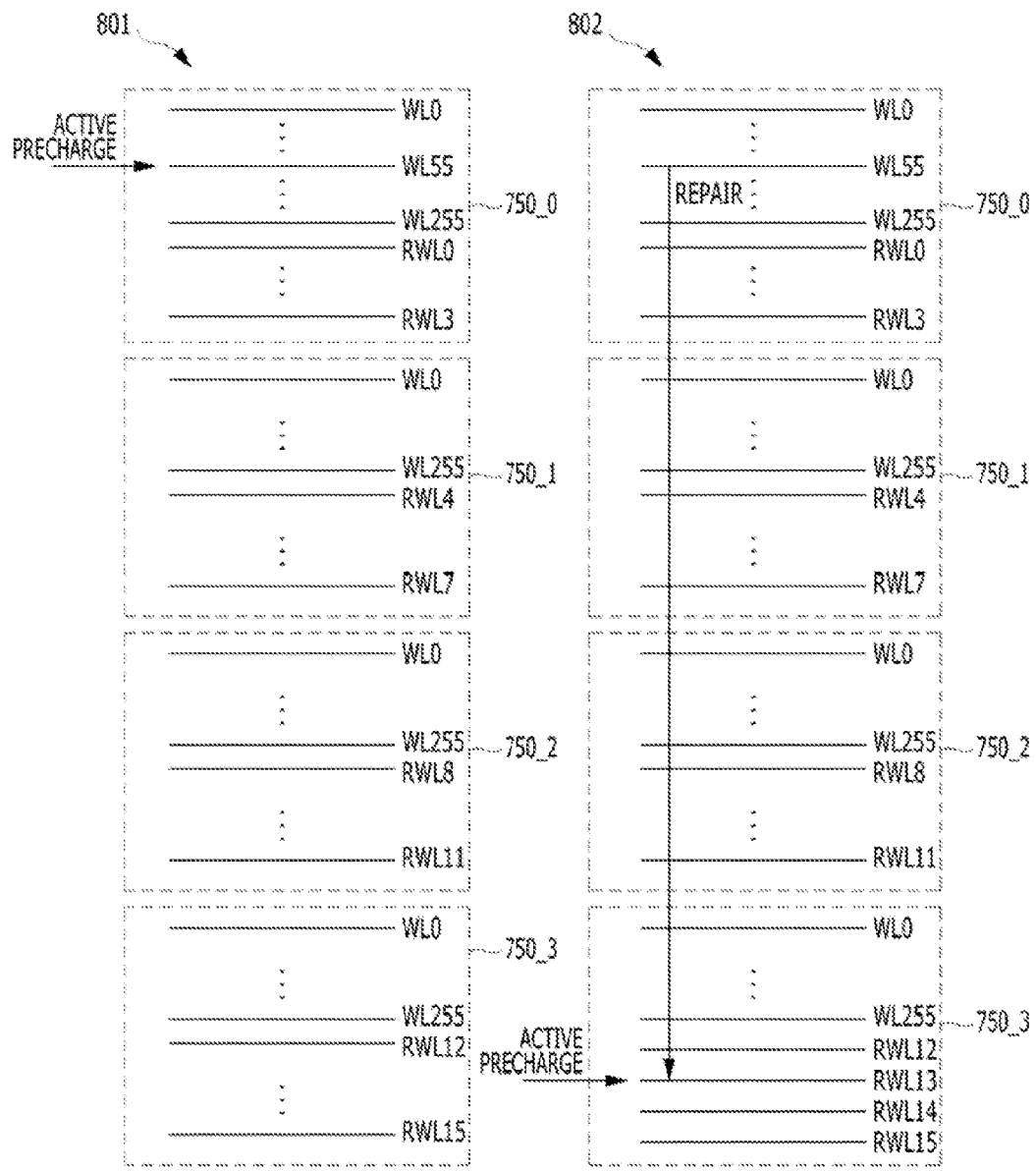
FIGS. 8A and 8B are diagrams illustrating the operation of the memory device of FIG. 7.
Figure 8B:
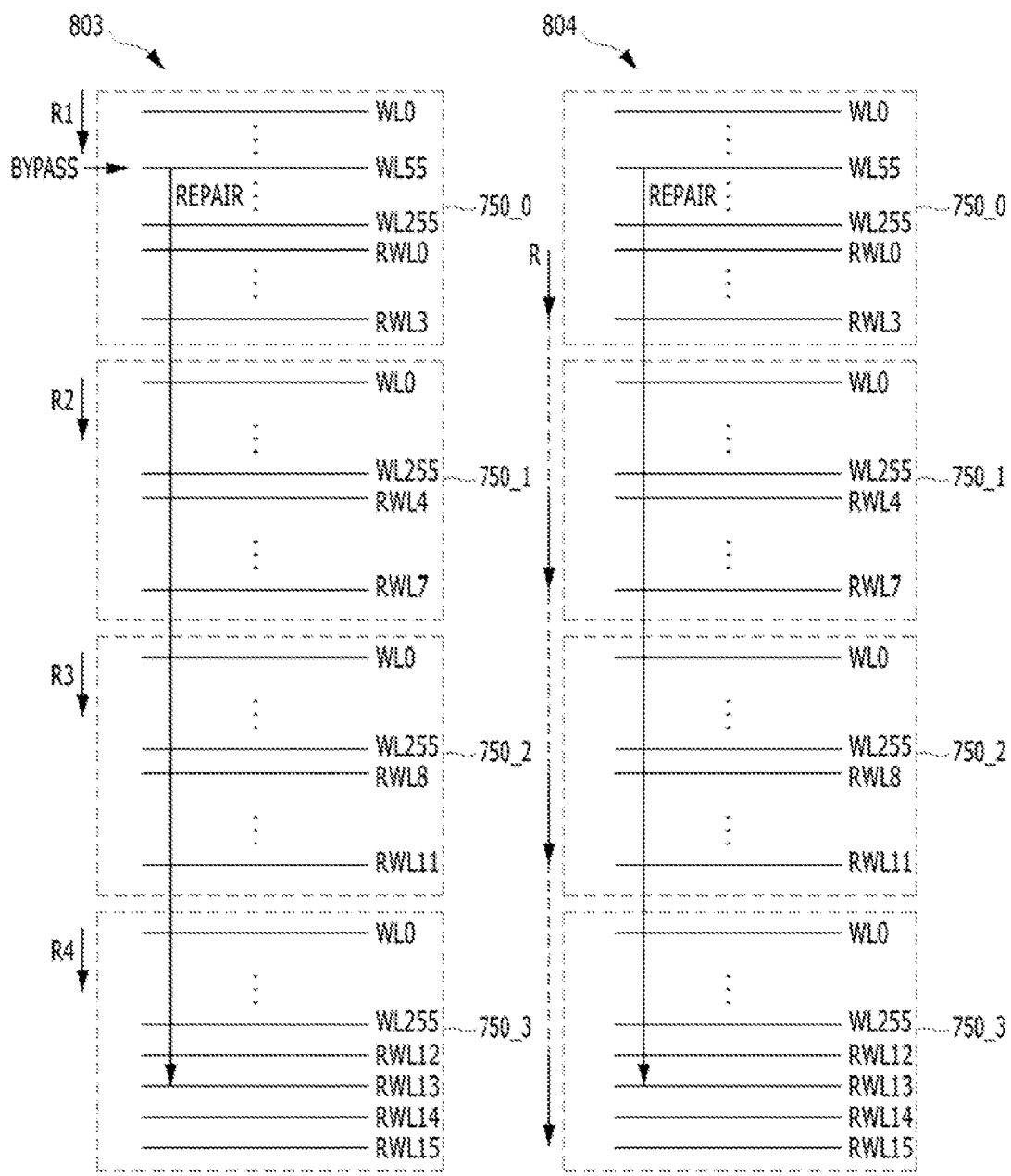

FIGS. 8A and 8B are diagrams illustrating the operation of the memory device of FIG. 7. FIG. 8A is a diagram illustrating the active operation of the memory device, and FIG. 8B is a diagram illustrating the refresh operation of the memory device. Referring to FIGS. 8A and 8B, in order to describe an operation for activating or refreshing a word line in the memory device, the first to fourth cell blocks 750_0 to 750_3 and the word lines WL0 to WL255 and the redundancy word lines RWL0 to RWL15 have been illustrated.

A left-sided diagram 801 of FIG. 8A illustrates that a word line (e.g., the word line WL55 of the first cell block 750_0) corresponding to the input address ADD<0:9> in the memory device has not been repaired. A right-sided diagram 802 of FIG. 8A illustrates that a word line (e.g., the word line WL55 of the first cell block 750_0) corresponding to the input address ADD<0:9> in the memory device has been repaired (e.g., replaced by the redundancy word line RWL13).

Referring to the diagram 801, when the active command ACT is applied and the word line WL55 of the first cell block 750_0 is selected by the address ADD<0:9>, the word line WL55 of the first cell block 750_0 is activated. Thereafter, when the precharge command PRE is activated, the word line WL55 of the first cell block 750_0 is precharged.

Referring to the diagram 802, when the active command ACT is applied and the word line WL55 of the first cell block 750_0 is selected by the address ADD<0:9>, the redundancy word line RWL13 is activated instead of the word line WL55 of the first cell block 750_0. When the precharge command PRE is activated, the redundancy word line RWL13 is precharged.

A FIG. 803 on the left of FIG. 8B illustrates a refresh operation in the first section, and a FIG. 804 on the right of FIG. 8B illustrates a refresh operation in the second section. Likewise, as shown in the diagram 802 of FIG. 8A, it is assumed that in the memory device, the word line WL55 of the first cell block 750_0 has been replaced by the redundancy word line RWL13.

Referring to the diagram 803, in the first section, the first to the second cell blocks 750_0 to 750_3 are refreshed one at a time. In the diagram 803, arrows R1 to R4 denote refresh directions.

When the word lines WL0 to WL54 have been sequentially refreshed and the word line WL55 is to be refreshed in the first to fourth cell blocks 750_0 to 750_3, the word lines WL55 of the second to fourth cell blocks 750_1 to 750_3 are properly refreshed. In contrast, the word line WL55 of the first cell block 750_0 is not refreshed, and the redundancy word line RWL13 that has replaced the word line WL55 is not refreshed. Thereafter, when the word lines WL255 of the first to fourth cell blocks 750_0 to 750_3 are refreshed, the first section terminates, and the second section starts. Referring to the diagram 804, in the second section, the redundancy word lines RWL0 to RWL15 are sequentially refreshed. In the diagram 804, an arrow R denotes a refresh direction. In this case, the refresh of a defective redundancy word line may be bypassed. When the redundancy word line RWL15 is refreshed, the second section terminates, and the first section starts.

In the memory device of FIG. 7, a refresh section is divided into two refresh sections, and a word line and a redundancy word line are refreshed in different sections. A repaired word line is skipped without being refreshed in a section for refreshing word lines. Instead, a redundancy word line replacing the repaired word line is refreshed in a section for refreshing redundancy word lines. Accordingly, two word lines being refreshed in one cell block at the same time is prevented. A word line of one cell block may be repaired using a redundancy word line of any other cell block, thereby increasing utilization efficiency of redundancy word lines. Refresh operations may be quickly completed because all the cell blocks are refreshed simultaneously.

Figure 9:
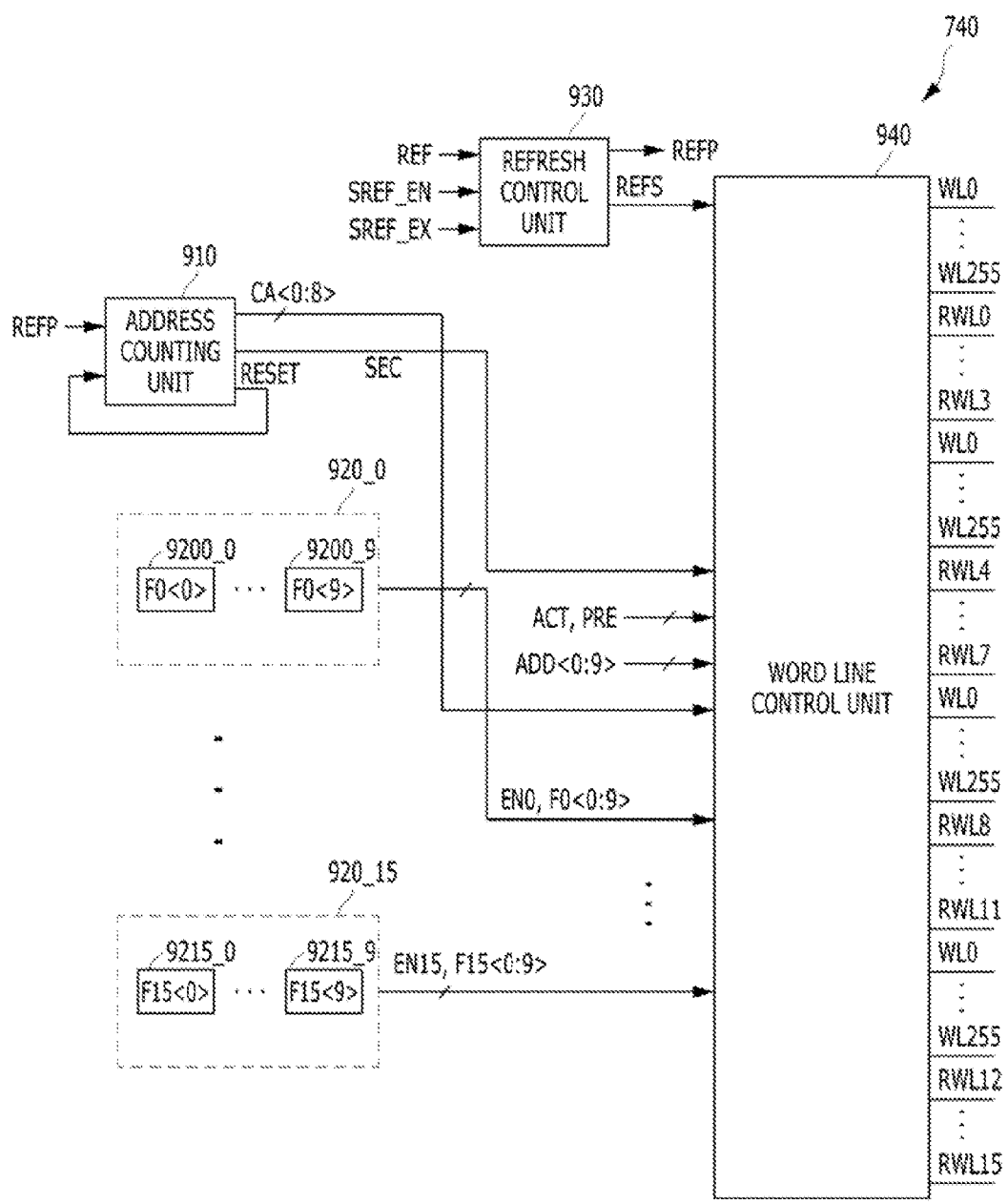
FIG. 9 is a configuration diagram illustrating a control unit 740 of FIG. 7.

FIG. 9 is a configuration diagram illustrating the control unit 740 of FIG. 7.

Referring to FIG. 9, the control unit 740 may include an address counting unit 910, first to sixteenth address storage units 920_0 to 920_15, a refresh control unit 930, and a word line control unit 940.

The address counting unit 910 may deactivate a section signal SEC while counting the values of counting addresses CA<0:8> as values (e.g., 0 to 255) corresponding to the word lines WL0 to WL255 of the first to fourth cell blocks 750_0 to 750_3 and may activate the section signal SEC while counting the values of the counting addresses CA<0:8> as values (e.g., 256 to 271) corresponding to the redundancy word lines RWL0 to RWL15. When the value of the counting address CA<0:8> reaches 271, the address counting unit 910 may activate the reset signal RESET and count the counting address CA<0:8> from 0 again. The address counting unit 910 may output only the counting addresses CA<0:7>.

The address storage units 920_0 to 920_15 may correspond to the respective redundancy word lines RWL0 to RWL15. The address storage units 920_0 to 920_15 may include a plurality of fuses 9200 to 9215 for storing multi-bit information.

The fuses 9200_8~9200_9 to 9215_8~9215_9 may store bits F0<8:9> to F15<8:9> that designate a cell block in repair addresses. The fuses 9200_0~9200_7 to 9215_0~9215_7 may store bits F0<0:7> to F15<0:7> that designate a word line within a cell block in repair addresses. If block addresses F<8:9> are "00", "10", "01", and "11", they may correspond to the first to fourth cell blocks 750_0 to 750_3.

When a refresh signal REFS is activated in the first section (i.e., the section in which the section signal SEC has been deactivated), the word line control unit 940 may refresh word lines that correspond to the counting address CA<0:7> in the first to fourth cell blocks 750_0 to 750_3 simultaneously. In this case, if the counting address CA<0:7> is identical with one or more of repair addresses F0<0:7> to F15<0:7>, the refresh of word lines and redundancy word lines corresponding to the one or more of repair addresses F0<0:9> to F15<0:9> may be bypassed.

When the refresh signal REFS is activated in the second section (i.e., the section in which the section signal SEC has been activated), the word line control unit 940 may refresh a redundancy word line corresponding to the counting addresses CA<0:3>. In this case, the refresh of a defective redundancy word line of the redundancy word lines RWL0 to RWL15 may be bypassed. That is, in the second section, the word line control unit 940 may not refresh the first to fourth cell blocks 750_0 to 750_3, but may sequentially refresh the redundancy word lines RWL0 to RWL15.

Figure 10:
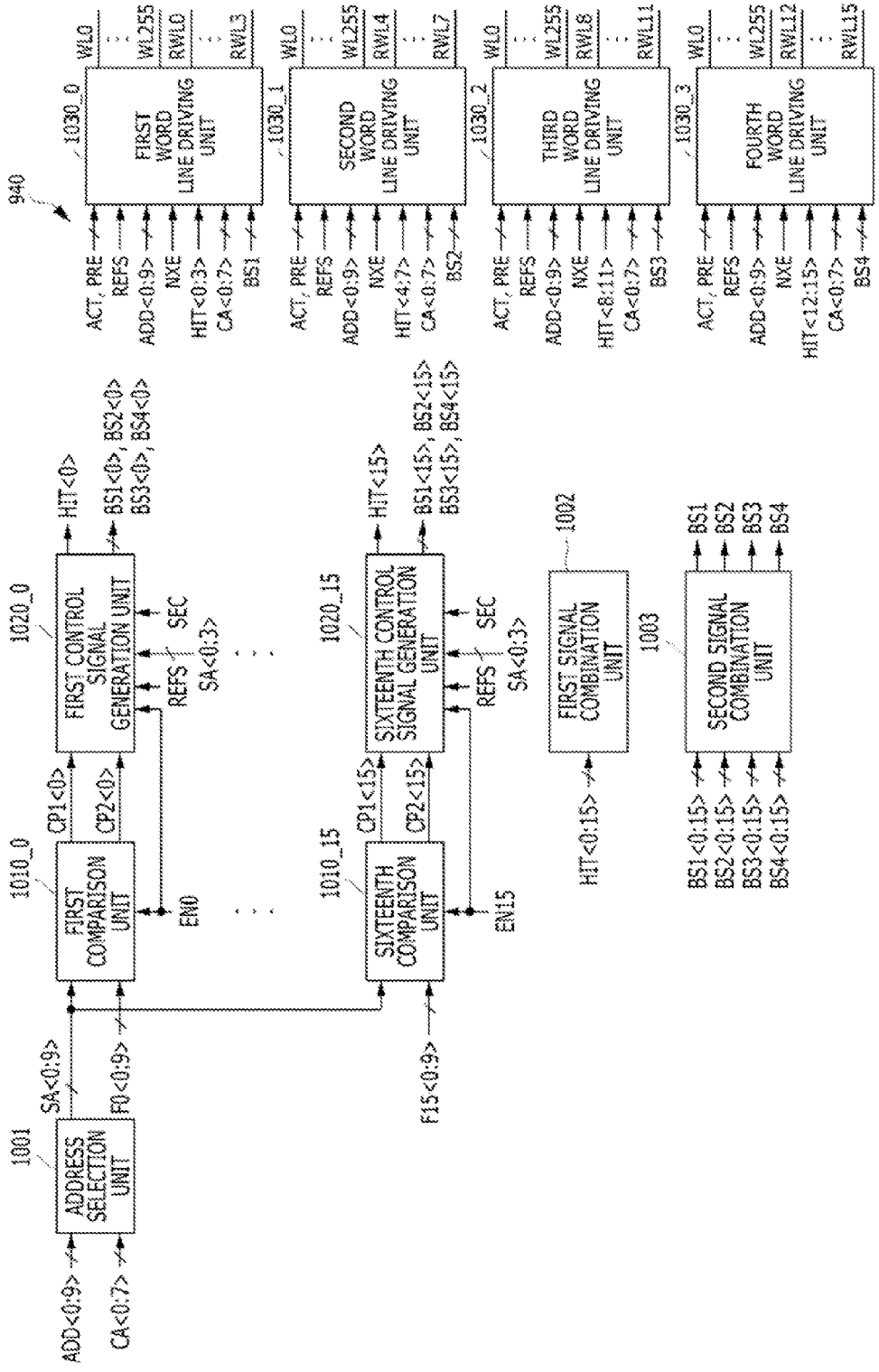
FIG. 10 is a configuration diagram illustrating of a word line control unit 940 of FIG. 9.

FIG. 10 is a configuration diagram illustrating the word line control unit 940 of FIG. 9.

Referring to FIG. 10, the word line control unit 940 may include first to sixteenth comparison units 1010_0 to 1010_15, first to sixteenth control signal generation units 1020_0 to 1020_15, first to fourth word line driving units 1030_0 to 1030_3, an address selection unit 1001, and first and second signal combination units 1002 and 1003.

The address selection unit 1001 may receive an address ADD<0:9> and a counting address CA<0:7>, may select one address, and may output the selected address (i.e., it becomes the input address SA<0:9> of the comparison units 1010_1 to 1010_15). When the refresh signal REFS is deactivated, the address selection unit 1001 may transfer the addresses ADD<0> to ADD<9> as respective input addresses SA<0> to SA<9>. When the refresh signal REFS is activated, the address selection unit 1001 may transfer the counting addresses CA<0> to CA<7> as the input addresses SA<0> to SA<7>.

If respective enable signals EN0 to EN15 have been activated, the comparison units 1010_0 to 1010_15 may compare the input address SA<0:9> with the respective repair addresses F0<0:9> to F15<0:9> of the respective address storage units 920_0 to 920_15 and generate respective comparison signals CP1<0:15> and respective comparison signals CP2<0:15>. The first comparison signals CP1<0> to CP1<15> may indicate the results of comparisons between the input address SA<0:7> and the respective repair addresses F0<0:7> to F15<0:7>, and the second comparison signals CP2<0> to CP2<15> may indicate the results of comparisons between the input address SA<8:9> and the respective repair addresses F0<8:9> to F15<8:9>. The first comparison signal CP1<X> (X is an integer of 0≤X≤15) may be activated when the input address SA<0:7> is identical with the repair address FX<0:7>. The second comparison signal CP2<X> may be activated when the input address SA<8:9> is identical with the repair address FX<8:9>.

The control signal generation units 1020_0 to 1020_15 may generate control signals HIT<0:15> and bypass signals BS1<0:15> to BS4<0:15>, for controlling a redundancy word line based on the comparison results CP1<0:15> and CP2<0:15> of the comparison units 1010_0 to 1010_15. The first to fourth bypass signals BS1<0:15> to BS4<0:15> may correspond to the first to fourth cell blocks 750_0 to 750_3.

When the refresh signal REFS is deactivated, the control signal generation units 1020_0 to 1020_15 may activate the respective control signals HIT<0:15> when all of the corresponding comparison signals CP1<0:15> and CP2<0:15> are activated and may deactivate the control signals HIT<0:15> if not.

When the refresh signal REFS is activated and the section signal SEC is deactivated, the control signal generation units 1020_0 to 1020_15 may deactivate the respective control signals HIT<0:15>. Furthermore, the control signal generation units 1020_0 to 1020_15 may deactivate the bypass signals BS1<0:15> to BS4<0:15> if a corresponding comparison signal CP1<0:15> has been deactivated and may activate a bypass signal corresponding to a cell block designated by the values of the repair addresses F0<8:9> to F15<8:9> if a corresponding comparison signal CP1<0:15> has been activated.

For example, it is assumed that the repair address F0<0:9> has a value corresponding to the word line WL0 of the first cell block 750_0 (e.g., F<8:9>="00", and F<0:7>="000000000"). If the counting address CA<0:7> is "00000000", the comparison signal CP1<0> is activated. The control signal generation unit 1020_0 may activate the bypass signal BS1<0> corresponding to the value of the repair signal F0<8:9> so that the refresh of the first cell block 750_0 is bypassed.

When both the refresh signal REFS and the section signal SEC are activated, the control signal generation units 1020_0 to 1020_15 may decode the counting address CA<0:3> and activate the control signal HIT<0:15> corresponding to the value of the decoded counting address CA<0:3>. In this case, if the enable signal has been deactivated, a control signal corresponding to the value of the counting address CA<0:3> is not activated.

When one or more of the bypass signals BS1<0> to BS1<15> are activated, the second signal combination unit 1003 may activate the first bypass combination signal BS1. When one or more of the bypass signals BS2<0> to BS2<15> are activated, the second signal combination unit 1003 may activate the second bypass combination signal BS2. When one or more of the bypass signals BS3<0> to BS3<15> are activated, the second signal combination unit 1003 may activate the third bypass combination signal BS3. When one or more of the bypass signals BS4<0> to BS4<15> are activated, the second signal combination unit 1003 may activate the fourth bypass combination signal BS4.

The operations of the first to the fourth word line driving units 1030_0 to 1030_3 are similar to those of the word line driving units 630 and 640 of FIG. 6 except for the number of word lines controlled and the number of redundancy word lines controlled.

In the above description, repairing a word line may mean that a redundancy word line is used instead of the word line by substituting the word line.

The memory device of this technology may improve utilization efficiency of redundancy word lines by repairing a word line of one cell block using a redundancy word line of another cell block.

Furthermore, the memory device of this technology may refresh the word lines of a plurality of cell blocks by refreshing all the word lines and then refreshing redundancy word lines although a word line of a cell block has been substituted with a redundancy word line of another cell block.

Although various embodiments have been described for illustrative purposes, it will be apparent to those skilled in the art that 15 various changes and modifications may be made without departing from the spirit and scope of the invention as defined in the following

What is claimed is:

1. A memory device, comprising:
   a first cell block comprising a plurality of word lines and first to $K^{th}$ (K is a natural number) redundancy word lines;
   a second cell block comprising a plurality of word lines and $(K+1)^{th}$ to $N^{th}$ (N is a natural number greater than K) redundancy word lines; and
   a control unit suitable for controlling the first to $N^{th}$ redundancy word lines to replace the word lines of the first or second cell block, refreshing the word lines of the first and the second cell blocks simultaneously in a first section, and sequentially refreshing the first to $N^{th}$ redundancy word lines in a second section.

2. The memory device of claim 1, wherein the control unit refreshes the word lines of the first and the second cell blocks while skipping word lines replaced with the redundancy word lines in the first section.

3. The memory device of claim 1, wherein the control unit refreshes the word lines of the first and the second cell blocks without refreshing the first to $N^{th}$ redundancy word lines in the first section.

4. The memory device of claim 1, wherein the control unit sequentially refreshes the word lines of the first cell block and the word lines of the second cell block one by one in the first section.

5. The memory device of claim 1, wherein the control unit comprises:
   an address counting unit suitable for generating a counting address by counting when a refresh operation is performed,
   wherein the control unit selects the word lines of the first and the second cell blocks using the counting address in the first section and selects the first to $N^{th}$ redundancy word lines using the counting address in the second section.

6. The memory device of claim 1, wherein the control unit sequentially refreshes the first to $N^{th}$ redundancy word lines while skipping a defective redundancy word line of the first to $N^{th}$ redundancy word lines in the second section.

7. A memory device, comprising:
   a first cell block comprising a plurality of word lines and first to $K^{th}$ (K is a natural number) redundancy word lines;
   a second cell block comprising a plurality of word lines and $(K+1)^{th}$ to $N^{th}$ (N is a natural number greater than K) redundancy word lines;
   first to $N^{th}$ address storage units corresponding to the first to $N^{th}$ redundancy word lines and suitable for storing addresses of the word lines of the first or second cell block;
   an address counting unit suitable for storing a counting address by counting when a refresh operation is performed; and
   a word line control unit suitable for simultaneously refreshing word lines that belong to the first and the second cell blocks and correspond to the counting address in a first section, and refreshing a redundancy word line that belongs to the first to $N^{th}$ redundancy word lines and corresponds to the counting address in a second section,
   wherein when the counting address is identical to one or more of the addresses stored in the address storage units in the first section, the word line control unit skips refreshing the word line corresponding to the counting address.

8. The memory device of claim 7, wherein the word line control unit refreshes the word lines of the first and the second cell blocks without refreshing the first to $N^{th}$ redundancy word lines in the first section, even when the counting address is identical with the one or more of the addresses stored in the address storage units.

9. The memory device of claim 7, wherein the first to $N^{th}$ address storage units comprise a plurality of fuses suitable for storing addresses.

10. The memory device of claim 7, wherein the word line control unit comprises:
    first to $N^{th}$ comparison units suitable for comparing addresses of the first to $N^{th}$ address storage units with an input address; and
    first to $N^{th}$ control signal generation units each suitable for:
    generating a control signal for controlling a corresponding one of the first to $N^{th}$ redundancy word lines by decoding the counting address in the second section and deactivating the control signal in the first section; and
    generating first and second bypass signals corresponding to the first and the second cell blocks by activating the first and second bypass signals corresponding to a cell block indicated by an address stored in a corresponding address storage unit when the counting address is identical with the address of the corresponding address storage unit in the first section.

11. The memory device of claim 10, wherein the word line control unit further comprises:
    a first word line driving unit corresponding to the first cell block, and suitable for refreshing a word line corresponding to the counting address without performing the refresh operation when the first bypass signal is activated, in the first section, and refreshing a redundancy word line that belongs to the first to $K^{th}$ redundancy word lines and corresponds to an activated control signal, in the second section; and
    a second word line driving unit corresponding to the second cell block, and suitable for refreshing a word line corresponding to the counting address without performing the refresh operation when the second bypass signal is activated, in the first section, and refreshing a redundancy word line that belongs to the $(K+1)^{th}$ to $N^{th}$ redundancy word lines and corresponds to an activated control signal, in the second section.

12. The memory device of claim 11, wherein each of the first to $N^{th}$ control signal generation units activates the control signal when the address of the corresponding address storage unit is identical with the input address when an active operation is performed.

13. The memory device of claim 12, wherein the first and the second word line driving units activate redundancy word lines corresponding to an activated control signal when the active operation is performed.

14. The memory device of claim 7, wherein the address counting unit is suitable for:
   generating a section signal to indicate the first section while counting a value of the counting address from a value corresponding to a first word of the plurality of word lines of the first and the second cell blocks to a value corresponding to a last word line of the plurality of word lines of the first and the second cell blocks; and
   generating the section signal to indicate the second section while counting the value of the counting address from a value corresponding to the first redundancy word line to a value corresponding to the $N^{th}$ redundancy word line.

15. The memory device of claim 7, wherein the word line control unit skips refreshing a defective redundancy word line of the first to $N^{th}$ redundancy word lines in the second section.

16. A memory device, comprising:
   a plurality of cell blocks comprising a plurality of word lines;
   a plurality of redundancy word lines suitable for replacing the word lines of the cell blocks; and
   a control unit suitable for refreshing the word lines of the cell blocks simultaneously, except for the word lines replaced by the redundancy word lines, in a first section, and sequentially refreshing the redundancy word lines in a second section.

17. The memory device of claim 16, wherein the control unit refreshes the word lines of the cell blocks without refreshing the redundancy word lines in the first section.

18. The memory device of claim 16, wherein the control unit sequentially refreshes the word lines of the cell blocks one by one in the first section.

19. The memory device of claim 16, wherein the control unit sequentially refreshes the redundancy word lines while skipping a defective redundancy word line in the second section.

* * * * *